United States Patent [19]

Vaillancourt

[11] Patent Number: 5,216,637

[45] Date of Patent: Jun. 1, 1993

[54] HIERARCHICAL BUSING ARCHITECTURE FOR A VERY LARGE SEMICONDUCTOR MEMORY

[75] Inventor: Steven Vaillancourt, Carson, Calif.

[73] Assignee: TRW Inc., Redondo Beach, Calif.

[21] Appl. No.: 623,832

[22] Filed: Dec. 7, 1990

[51] Int. Cl.$^5$ .............................................. G11C 8/00
[52] U.S. Cl. ......................... 365/230.03; 365/230.01
[58] Field of Search ............... 365/230.03, 230.01, 365/200

[56] References Cited

U.S. PATENT DOCUMENTS

| | | | |
|---|---|---|---|
| 3,685,020 | 8/1972 | Meade | 365/230.03 |
| 4,688,197 | 8/1987 | Novak | 365/230.03 |
| 4,742,474 | 5/1988 | Knierim | 365/230.03 |
| 4,807,191 | 2/1989 | Flannagan | 365/200 |
| 4,916,603 | 4/1990 | Ryan | 365/230.03 |
| 4,958,323 | 9/1990 | Sugawara | 365/230.03 |
| 4,982,378 | 1/1991 | Matsushita | 365/230.03 |
| 5,025,420 | 6/1991 | Kimura | 365/230.03 |
| 5,033,624 | 7/1991 | O'Connell | 365/230.03 |
| 5,084,838 | 1/1992 | Kajimoto | 365/200 |

Primary Examiner—Eugene R. LaRoche
Assistant Examiner—D. Zarabian
Attorney, Agent, or Firm—Noel F. Heal; Ronald L. Taylor

[57] ABSTRACT

A very large memory structure in which the extent and capacitive loading of global buses are reduced by an arrangement in which global data, address and control buses are connected to column buses through a column disable block for each column of memory modules. The column disable blocks also provide for selection of only a subset of data lines for connection between the global data bus and an associated column data bus. Further, a column disable register in each column disable block permits output from the column data bus to be selectively ignored on the basis of bit position. The column disable registers are uniquely addressable by column, for the selective disablement of column data bus lines. In the described embodiment of the invention, the global buses are triply redundant and the column disable blocks also include voting circuitry for processing of signals from the global buses.

10 Claims, 6 Drawing Sheets

HIERARCHICAL BUSING ARCHITECTURE FOR A VERY LARGE SEMICONDUCTOR MEMORY

BACKGROUND OF THE INVENTION

This invention relates generally to semiconductor memory structures and, more particularly, to techniques for configuring and testing very large memory arrays, which have a relatively high probability of containing defective memory cells. A semiconductor integrated-circuit memory takes the form of a two-dimensional array of memory cells fabricated together on a single semiconductor chip. Each memory cell typically stores one binary digit or bit of information, and the array is usually designed to store multiple "words" of information, each word having the same number of bits. A common data word length is eight bits, which is referred to as a "byte." For convenience in handling binary cell addresses, the number of words in a memory array is usually a power of two, such as 1,024, 2,048, 4,096, and so forth. Each 1,024 words or bytes of memory is often referred to as "1 k" of memory. For example, a 2 k memory contains 2,048 words, bytes or bits of memory.

As the area of a semiconductor chip increases, so does the probability that there will be manufacturing defects within the chip. The manufacturing "yield" is the percentage of defect-free chips obtained in a production run. The probability of occurrence of manufacturing defects in a unit surface chip area is approximately constant for a particular fabrication process. Therefore, larger chips will have more defects and a lower yield of defect-free circuits. Although the area of a specific circuit can be decreased by further reducing the scale of integration, i.e. by reducing the size of the circuit features and their spacing, this will ultimately result in an increase in the number of defects and a reduction in the production yield.

An alternative to reducing the size of a circuit is to increase the effective production yield by rendering the resulting circuits more tolerant to defects, so that defective circuits can be repaired rather than discarded. Basically, this approach involves designing the circuit to include redundant or spare components, which can be connected into the circuit to replace components that have become defective.

Another source of defects is radiation damage. This is highly significant for applications of circuitry to be used in space, where memory cells are subject to damage by cosmic radiation. If only a single memory cell were to be damaged, the defect could be overcome by the use of an appropriate error detection and correction technique. A single-bit error in a relatively large data word can be detected and corrected in this way without the need for reconfiguring the circuitry. However, there is a high probability that a cosmic radiation "strike" on a memory cell would disable not just one cell, but several physically adjacent cells as well. If these damaged cells were all in the same data word, recovery by error detection and correction methods would not be possible. Accordingly, the ideal technique for configuring a memory circuit should be one that minimizes the effects of radiation damage.

Without some technique for increasing the production yield of semiconductor memory arrays, the size of such arrays is effectively limited and may not be easily increased to encompass an entire semiconductor wafer. U.S. Pat. No. 4,653,050 to Vaillan-court proposes a solution to this problem, whereby a large memory array comprises a number of memory modules, each of $1 \times N$ bits in size. The memory array is treated as having P logical "pages," each with N multi-bit words. Each module provides one bit of memory at the same bit position in every word in a logical page of memory. A damaged module therefore affects only one bit in each word, and the missing bit can be reconstructed using conventional error detection and correction techniques. A memory mapping module provides transformation from logical memory addresses to physical addresses within the modules. Although this approach is satisfactory in many applications, it has the disadvantage that a single, relatively complex memory mapping unit is responsible for mapping memory locations for the entire memory array.

An ideal wafer-scale memory array has the ability to distribute each bit of a stored data word to a different memory module. However, for a 32-bit data word, for example, this would appear to require that a 32-bit data bus be connected to each of the memory modules in the array. This routing of the data bus over a large area of the circuit would render the array more vulnerable to defects, whether resulting from manufacture or from radiation damage. Moreover, each data bus line would need to carry a capacitive load proportional to the total number of memory modules. For these reasons, any scheme for minimizing damage to the memory array should also minimize the extent to which the data bus has to be routed throughout the array. One approach to solving these problems was described and claimed in a patent application Ser. No. 07/498,882 filed on Mar. 26, 1990 in the name of Cameron Wade. The present application discloses an alternative and improved approach to this data busing problem.

SUMMARY OF THE INVENTION

The present invention resides in a hierarchical busing architecture for use in a very large semiconductor memory. Briefly, and in general terms, the structure of the invention includes a plurality of memory modules, arranged in a memory array of N columns of n modules each; a global data bus, a global address bus and a global control bus, all extending through the memory array in close proximity to the columns of modules; a column data bus, a column address bus and a column control bus for each column of modules, extending in close proximity to the modules in each column; and a plurality N of column disable blocks, each connected to provide an interface between the column data, address and control buses and the global data, address and control buses.

More specifically each column disable block includes a column disable register, to selectively disable output from selected data lines of the column data bus to which the column disable block is connected. Each column disable block further includes a hardwired column address uniquely identifying the column, a column address comparator, and means for enabling loading of the disable register upon detection of a match between the hard-wired column address and a column address supplied to all of the column disable blocks.

In the presently preferred embodiment of the invention, the global data, address and control buses are triply redundant, and each of the column disable blocks includes voting means for each of the global buses. Further, the columns of modules are divided into a number of column groups, and each column disable block connects only a selected number of data lines from the global data bus to the column data bus for the column to which the block is connected. The same data lines are selected for all columns in the same column group, and the number of data lines in the column data buses is thereby greatly reduced.

It will be appreciated from this brief summary that the invention represents a significant improvement in the field of large reconfigurable memories. In particular, the invention reduces the extent and loading of busing structures in a memory, yet provides a versatile arrangement under which data on column data buses can be selectively ignored in the event of detected errors. Other aspects and advantages of the invention will become apparent from the following more detailed description, taken in conjunction with the accompanying drawings.

DESCRIPTION OF THE PREFERRED EMBODIMENT

As shown in the drawings for purposes of illustration, the present invention is concerned with a hierarchical busing architecture for a large semiconductor memory having multiple memory modules that are addressed by a logical page and word address, and in which each bit of each stored data word is stored in a different physical memory module, to minimize loss of data if a memory module is damaged. Although this is a relatively simple concept, it becomes difficult to implement if global data and address buses have to be connectable to every module in the memory.

In accordance with the invention, a large memory is connected to global data, address and control buses in a such a manner that each bus line does not have to be connectable to every memory module. The environment in which the present invention operates is a large semiconductor memory system.

In general, all large memories of this type have multiple physical memory cells, which will be referred to as memory modules or memory macrocells. Each module is logically organized to have 1×m bits, where m is typically 2,048 or some other convenient number. The modules may be thought of as arranged in an array of rows and columns. A convenient data word size for a large memory is chosen, for example 22 bits, which include codes used for error detection and correction. Thus an array of 22 modules could be used to provide storage for 2,048 22-bit words, but would have no spare modules at all.

Figure 1:
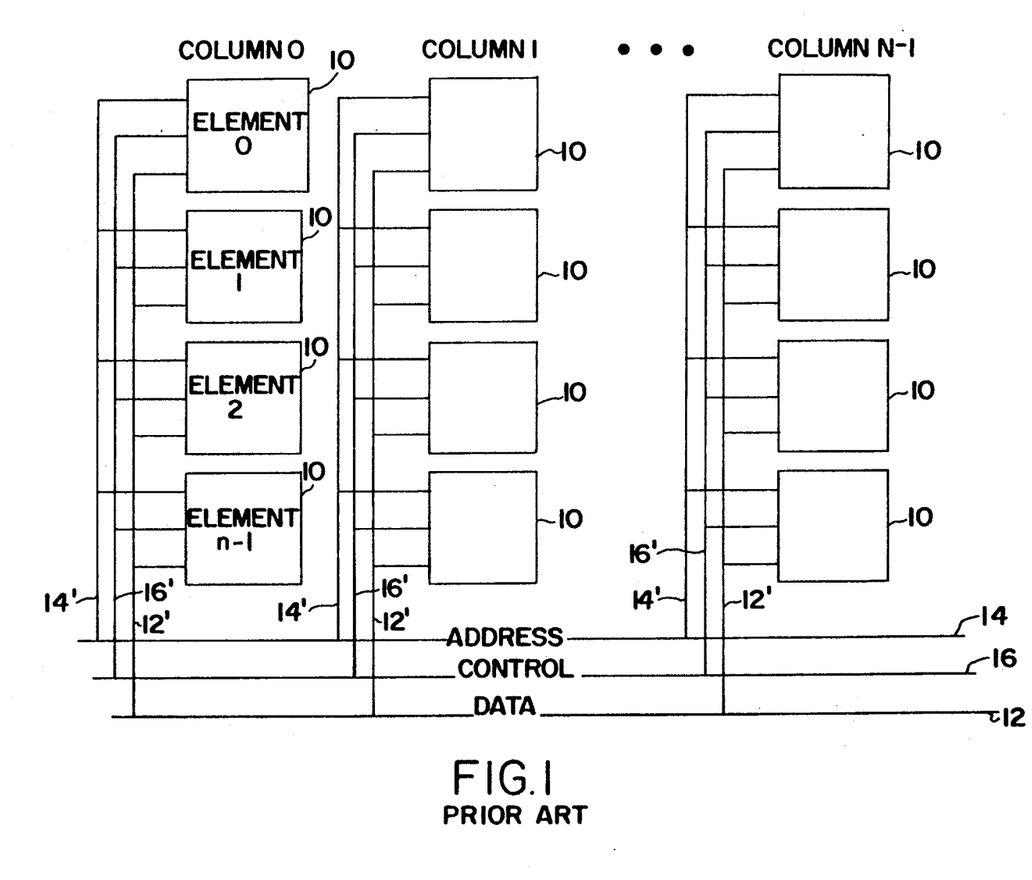
FIG. 1 is a block diagram showing a traditional approach to arranging bus connections to a plurality of memory modules in a very large memory.

FIG. 1 shows a conventional arrangement of multiple memory modules, indicated by reference numeral 10. The modules are arrayed in N columns, with n modules in each column. A global data bus 12, address bus 14 and control bus 16 extend perpendicularly to the columns, and column buses 12', 14' and 16' extend from the global buses along each of the columns, to make connections with the memory modules 10.

In the memory system to be described by way of example, there are 576 modules, indicated by reference numeral 10, arranged in thirty-six columns of sixteen modules each, i.e. N=36 and n=16. The 22-bit data words in the memory structure are addressed by a 16-bit data address, divided into an 11-bit RAM address or word address and a 5-bit page address. The RAM address determines which bit of each 2,048-bit module is accessed for reading or writing data. One may consider the modules to be arrayed in three-dimensional space, with the columns and rows of modules extending in two dimensions and the 2,048 memory elements of each module extending orthogonally in a third dimension. The 11-bit RAM address then determines the position of a "slice" through this three-dimensional memory structure. The page address identifies twenty-two specific modules within the array. These modules are used to store a data word specified by the page/RAM address, at the "slice" position specified by the RAM address. Finally, the bit assignments (0–21) in the data word must also be specified, so that each of the twenty-two modules making up a page is assigned to a unique bit position within each data word.

Configuration of the memory involves assigning each active memory module a unique combination of page number and bit position. Once these assignments are made, a memory write or read operation to or from a location specified by page and RAM address uses the page address to select an appropriate group of macrocells, uses the bit assignments to apply the individual data bits to their proper modules within the group, and uses the RAM or word address to select the appropriate bit slice in the modules.

The foregoing description tacitly assumes that each bit of a data word may be assigned to any macrocell in the array. For this to be true would require that data lines be bused to every module in the array, as shown in FIG. 1. While this is desirable from the standpoint of having complete freedom to assign data bits to any desired modules, it is impractical from a design standpoint to run a data bus to every module in the architecture. A data bus this extensive would be subject to additional defects during fabrication and during operation. Moreover, each line of the global data bus 12, for example, would have to be designed to carry a capacitive loading proportional to the total number of modules, n*N.

Figure 2:
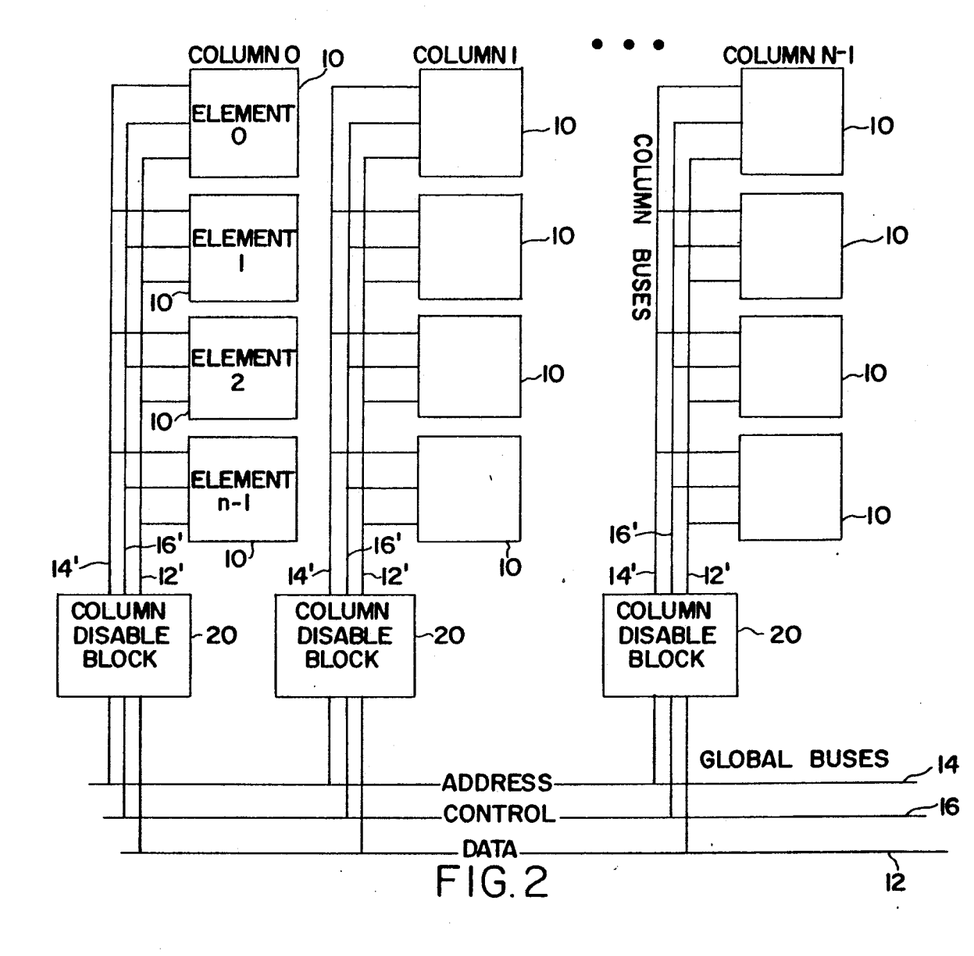
FIG. 2 is a block diagram showing the hierarchical busing architecture of the present invention.

By way of contrast, the hierarchical busing architecture of the present invention is shown diagrammatically in FIG. 2. Each column of modules 10 is connected to the global buses 12, 14, 16 through a column disable block 20. In this arrangement, each global bus line 12, 14, 16 carries N loads and each column bus line 12', 14', 16' carries n loads. As will soon be appreciated from the more detailed description of the column disable blocks 20, busing is further minimized because each column data bus 12' does not carry all the bits of a data word.

Figure 3:
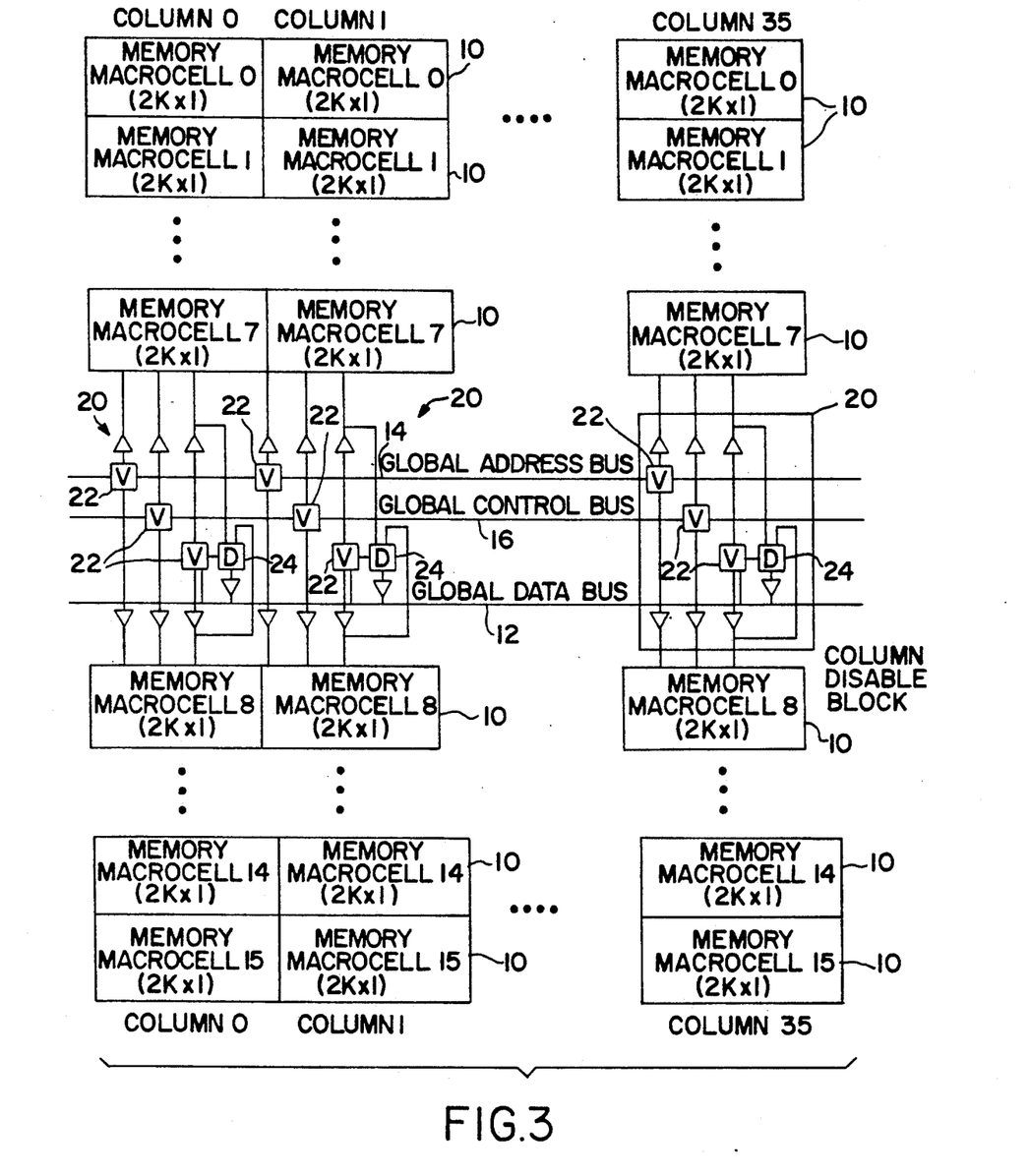
FIG. 3 is a block diagram of an alternative arrangement to FIG. 2, showing the memory modules arranged in half-columns.

In the embodiment of the invention shown in FIG. 3, the global data bus 12 extends row-wise through the center of the memory module array, dividing each column of modules 10 into half-columns. Further, each set of three adjacent columns is defined as a separate entity referred to as a reticle. In this architecture, the first column in each reticle receives only seven data bit lines from the global bus 12, specifically bits 0-6 of the 22-bit data word. Similarly, the second column of modules in each reticle receives only eight bits, specifically bits 7-14 of the data word, and the third column in each reticle receives the remaining seven bits, specifically bits 15-21 of the data word. Therefore, in this illustrative embodiment, bit position assignments are limited in the sense that only bit positions 0-6 can be assigned to modules in columns 0, 3, 6, and so forth up to column 33. Similarly, only bit positions 7-14 can be assigned to columns 1, 4, 7, and so forth up to column 34, and only bit positions 15-21 can be assigned to columns 2, 5, 8 and so forth up to 35.

The global address bus 14 and global control bus 16 also run through the center of the array, between the half-columns of modules. The data bus 12, address bus 14 and control 16 are connected through multiple column disable blocks 20 located between the half-columns of modules 10. In the presently preferred embodiment of the invention, the global buses 12, 14, 16 are all triply redundant, i.e. there are three identical buses of each type, and the column disable blocks 20 include voter circuits 22. As will be further described, the column disable blocks 20 also include a disable register 24, which permits reading operations to selectively ignore data from the modules 10 in the event of a previously detected defect.

The global address bus 14 is connected, through the column disable blocks 20, to each of the half-columns of modules 10. Similarly, the global control bus 16 supplies control signals to each of the half-columns. The global control and bus lines 14, 16 are used inside the column disable blocks 20, and effectively extend through the blocks to the half-columns. The data bus 12 differs from the other global buses in that no more than eight data bits are connected to each column bus 12' and thence to the memory modules 10. Data bits 0-6 are connected to the first column in each reticle, bits 7-14 to the second column in each reticle, and bits 15-22 to the third column in each reticle.

Figure 4:
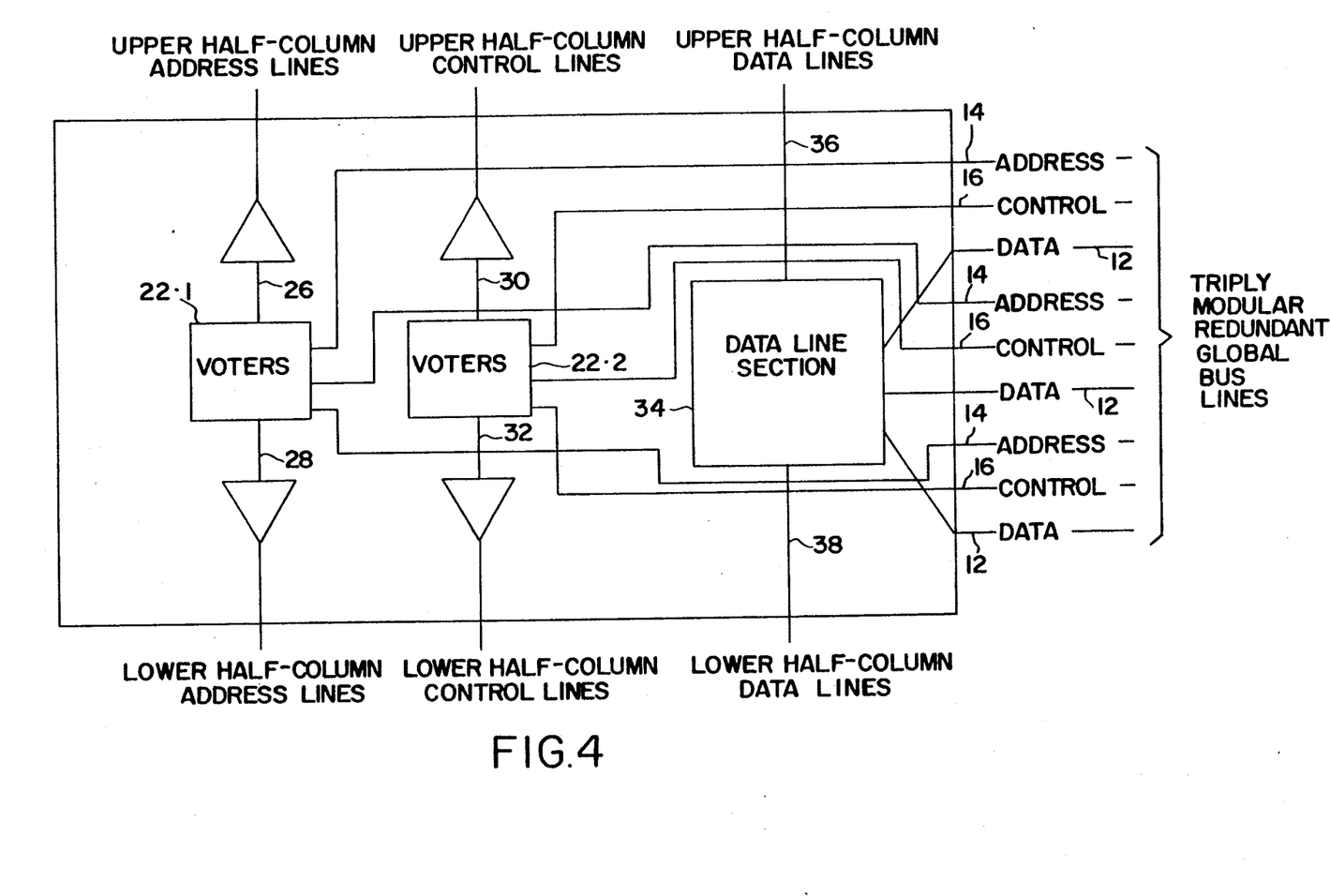
FIG. 4 is a block diagram of a module column disable block that forms an essential part of the architecture of FIG. 2.

Each column disable block 20 includes, as shown in FIG. 4, an address bus voting circuit 22.1, which receives three usually identical signals on three lines of the global address bus 14, and outputs voted address signals on lines 26, 28 to the half-columns of modules to which the column disable block is connected. Similarly, three lines of the global control bus 16 are connected to address voting circuit 22.2, from which outputs are supplied on lines 30 and 32 to the half-columns of modules. Three lines making up the global data bus 12 are connected to a data line section 34 of the column disable block 20, and this section (34) generates voted data signals on lines 36 and 38 to the half-columns of modules. The same lines 36 and 38 are used to read data from the modules onto the global data bus 12.

Figure 5:
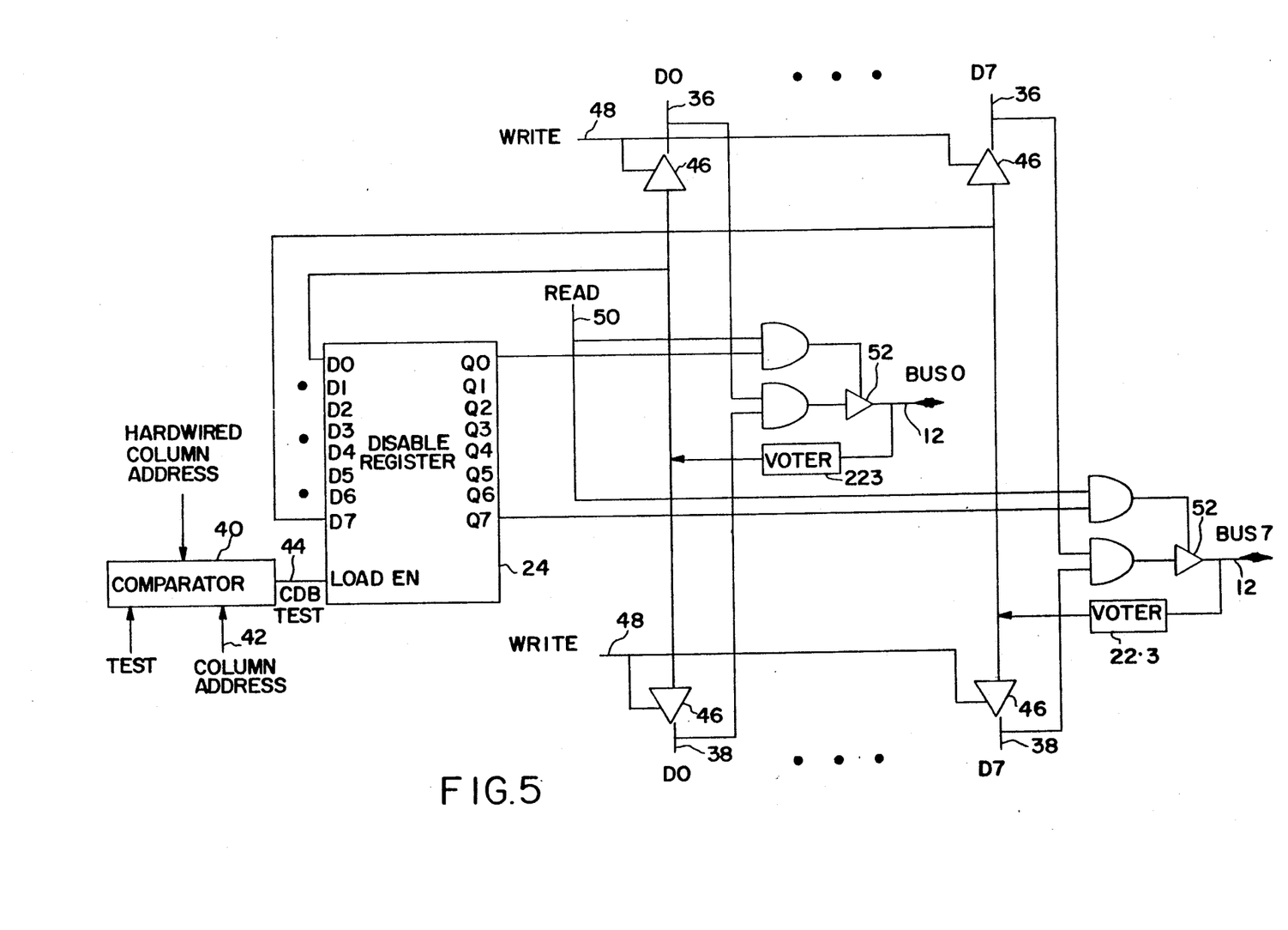
FIG. 5 is an expanded block diagram of the data section of the column disable block of FIG. 3.

The data line section 34 of the column disable block 20, as shown in in more detail in FIG. 5, includes the column disable register 24, voter circuits 22.3 for each of eight data bits, a comparator 40, and other logic to be described. The comparator 40 is used to compare a hard-wired column address with a column address indicated at 42. The column address in a test mode of operation is obtained from bits 4-9 of the address bus 14 (FIG. 4). These six bits provide for the addressing of 36 columns. The memory module address is obtained from bits 0-3 of the address bus, and bit 10 is used to convey serial data into the page and bit register 56, as will be described with reference to FIG. 6. If a match is detected by the comparator 40, an enabling signal is generated on output line 44, to enable the storing of data in the disable register 24 during operation in the column disable block test mode. Basically, during the test mode the disable register 24 is loaded, and during a normal operational mode, the TEST signal is low and the disable register functions to selectively inhibit global bus buffers during a read operation. The TEST signal, the READ signal (line 50) and the WRITE signal (line 48) are all supplied from the control bus 16.

During a write operation, from the data bus to the memory modules, data signals on the bus lines, two of which are shown at bit positions 0 and 7, are supplied to the voting circuits 22.3, and thence to output lines 36, 38 to the half-columns. Amplifiers 46 in the output lines are enabled by a write signal on line 48. For a read operation, a read signal on line 50 is ANDed with each of the eight output signals from the disable register 24, and the logical result is used to enable amplifiers 52 that connect the combined signals on lines 36, 38 onto the data bus 12. During testing of the column disable block, the disable register 24 is selectively cleared to indicate which bit positions contain unreliable data. During the read operation, the disable register 24 functions to disable those bit positions.

In the read operation, signals from two half columns 36, 38 are ANDed together before input to amplifier 52. At the start of each read cycle, the half columns and the global bust lines are precharged to a high condition. Thus the high condition is a default state and a low condition is an active state. This reduces the capacitive loading on the bus by at least one-half, because each global bus buffer only needs a pulldown device (typically implemented in NMOS technology), instead of both a pulldown device and a pullup device (implemented in PMOS). Moreover, a PMOS device is usually twice as large as a corresponding NMOS device to provide the same amount of current. Since the parasitic capacitance is proportional to the size of the device, the arrangement provides only about one-third of the driver capacitance. The time delay from source to sink (or driver to load) is proportional to RC (resistance times load capacitance), where $$C = C_{driver} + C_{wiring}.$$

Therefore, as C decreases RC also decreases, and the bus is faster. The precharge time is about 10-15 ns (nanoseconds), and is not really a penalty since, if three-state drivers were used, they would have to be shut off for a short time to avoid the possible case of having two buffers ON at the same time and in opposite states, causing a short-duration short circuit.

Figure 6:
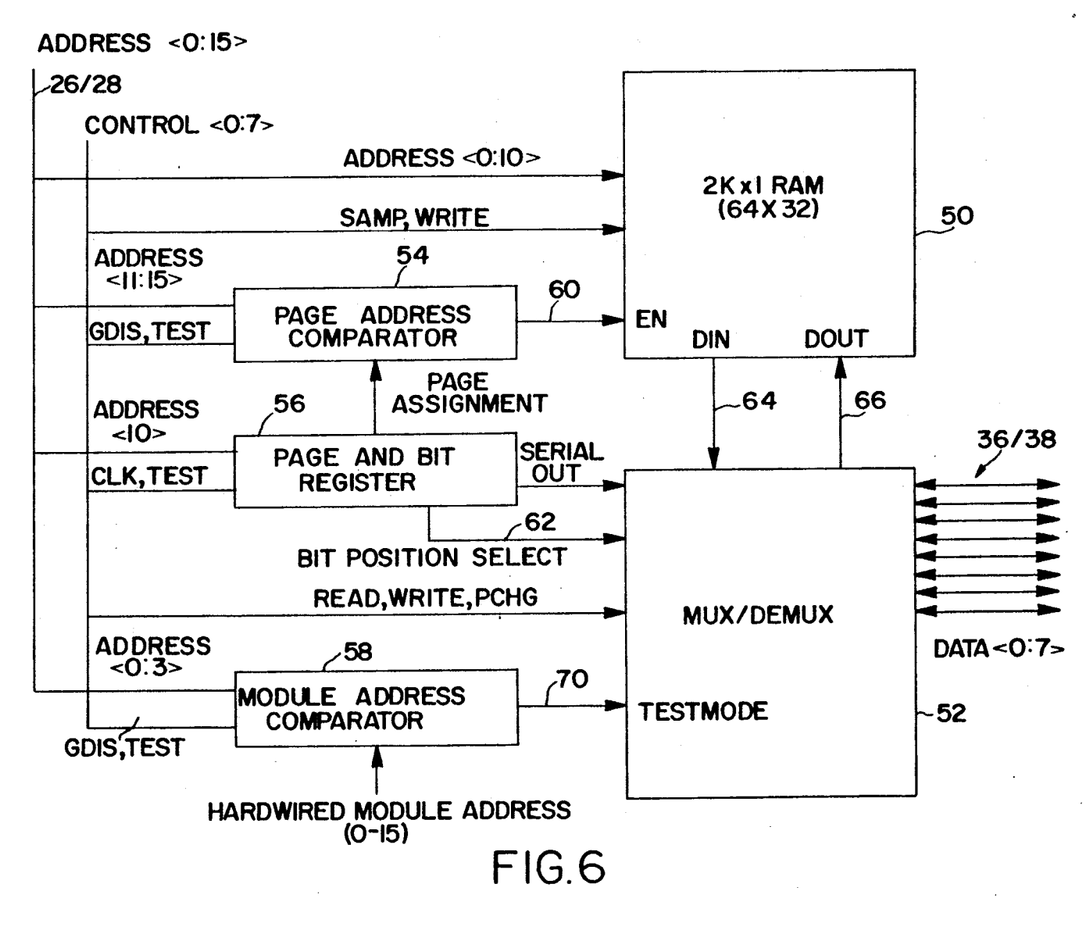
FIG. 6 is a block diagram of a memory module or memory macrocell used in the architecture of the invention.

The principal components of each memory macrocell 10 are, as shown in FIG. 6, a random access memory (RAM) 50 of 2,048×1 bit, a data multiplexer/demultiplexer 52, a page address comparator 54, a page and bit register 56 and a module address comparator 58. Eleven bits of the address lines 26/28 are connected to the RAM 50 to control addressing in the eleven lower-order bits of the data address. Bits 11-15 of the data address contain the page address and are supplied to the page address comparator 54. In the operational mode of the module, page and bit position assignments have been stored in the page and bit register 56. The page address supplied to the module 10 is compared with the page address stored in this register and, if a match is found, an enable signal is generated on output line 60 from the page address comparator 54, to enable operation of the RAM 50. At the same time, the bit position assigned to this module is supplied over line 62 to the multiplexer/demultiplexer 52. The bit position signal, for which three bits are needed, determines which of the eight data lines 36/38 is selected for reading or writing operation on the RAM 50. Data input and data output lines 64, 66 connect the multiplexer/demultiplexer 52 with the RAM 50.

In operation, if the module is selected for use, i.e. if the page address of the module matches the page address in a requested memory operation, a selected data bit is written to or read from the RAM at a location determined by the lower-order bits of the requested memory operation. In a test mode of operation, page and bit position assignments are stored in the page and bit register 56. In the illustrative embodiment, one bit of the address lines 26/28 is used to input data serially to the page and bit register 56. Data bits previously stored in the register are output serially over line 68 to the multiplexer/demultiplexer 52. Operation in the test mode is controlled in part by the module address comparator. A hard-wired module (macrocell) address is compared with an address supplied over the address lines 26/28, and a match signal on line 70 indicates that the test mode is to be entered.

It will be appreciated from the foregoing that the present invention represents a significant advance in the field of large memory systems. In summary, the invention provides a busing arrangement whereby global buses are connected to column buses through column disable blocks, reducing the capacitive loading on the buses. Moreover, since not all data bit positions are bused along all of the column buses, the number of data bus lines is greatly reduced, together with the problems inherent in fabricating a larger number of bus lines. The column disable blocks provide additional advantages, such as the ability to disable reading from the column modules for selected data bit positions of the column data bus, and the ability to address column disable blocks in a column test mode. The combined features of the invention provide increased manufacturing yield and improved reliability and versatility of operation. Further, the invention improves the speed of operation, since a driver does not have to drive as much capacitive load as before. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A hierarchical semiconductor memory architecture, comprising:
    a plurality of memory modules, arranged in a memory array of N columns of n modules each;
    a global data bus, a global address bus and a global control bus, all extending through the memory array in close proximity to the columns of modules;
    a column data bus, a column address bus and a column control bus for each column of modules, extending in close proximity to the modules in each column; and
    a plurality N of column disable blocks, each connected to provide an interface between the column data, address and control buses and the global data, address and control buses.

2. A hierarchical semiconductor memory architecture as defined in claim 1, wherein each column disable block includes:
    a column disable register, to selectively disable output from selected data lines of the column data bus to which the column disable block is connected.

3. A hierarchical semiconductor memory architecture as defined in claim 2, wherein each column disable block further includes:
    a hard-wired column address uniquely identifying the column;
    a column address comparator; and
    means for enabling loading of the disable register upon detection of a match between the hard-wired column address and a column address supplied to all of the column disable blocks.

4. A hierarchical semiconductor memory architecture as defined in claim 1, wherein:
    the global data, address and control buses are triply redundant; and
    each of the column disable blocks includes voting means for each of the global buses.

5. A hierarchical semiconductor memory architecture as defined in claim 1, wherein:
    the columns of modules are divided into a number of column groups;
    each of said column disable blocks connects only a selected number of data lines from the global data bus to the column data bus for the column to which the block is connected; and
    the same data lines are selected for all columns on the same column group;
    whereby the number of data lines in the column data buses is greatly reduced.

6. A hierarchical semiconductor memory architecture as defined in claim 2, wherein:
    the columns of modules are divided into a number of column groups;
    each of said column disable blocks connects only a selected number of data lines from the global data bus to the column data bus for the column to which the block is connected; and
    the same data lines are selected for all columns on the same column group;
    whereby the number of data lines in the column data buses is greatly reduced.

7. A hierarchical semiconductor memory architecture as defined in claim 3, wherein:
    the columns of modules are divided into a number of column groups;
    each of said column disable blocks connects only a selected number of data lines from the global data bus to the column data bus for the column to which the block is connected; and
    the same data lines are selected for all columns on the same column group;
    whereby the number of data lines int he column data buses is greatly reduced.

8. A hierarchical semiconductor memory architecture as defined in claim 4, wherein:
    the columns of modules are divided into a number of column groups;
    each of said column disable blocks connects only a selected number of data lines from the global data bus to the column data bus for the column to which the block is connected; and the same data lines are selected for all columns on the same column group;

whereby the number of data lines in the column data buses is greatly reduced.

9. A hierarchical semiconductor memory architecture, comprising:

a plurality of memory modules, arranged in a memory array of N columns of n modules each;

a triply redundant global data bus, a triply redundant global address bus and a triply redundant global control bus, all extending through the memory array in close proximity to the columns of modules;

a column data bus, a column address bus and a column control bus for each column of modules, extending together in close proximity to the modules in each column; and a plurality N of column disable blocks, each connected to provide an interface between the column data, address and control buses and the global data, address and control buses;

wherein each of the column disable blocks includes an address bus voting circuit for processing signals from the global address bus for transmission to the column address bus, a control bus voting circuit for processing signals from the global control bus for transmission to the column control bus, a data bus voting circuit for processing signals from a selected group of data lines of the global data bus, for transmission to the column data bus, means for selectively disabling reading of the column data lines in a read operation, including a column disable register for storing an indication of which data lines in the column bus are to be ignored, and means for loading the column disable register, including means for uniquely addressing the column disable register.

10. A hierarchical semiconductor memory architecture as defined in claim 9, wherein:

the columns of modules are divided into a number (g) of column groups, where N is a multiple of g;

each data word has B bits and is carried on B data lines of the global data bus;

each column disable block connects approximately B/g data lines from the global data bus to the column data bus for the column to which the block is connected; and the same data lines are selected for all columns in the same column group.

* * * * *